US009240242B1

(12) United States Patent  (10) Patent No.: US 9,240,242 B1
Lin et al.  (45) Date of Patent: Jan. 19, 2016

(54) METHOD FOR OPERATING LOW-COST EEPROM ARRAY

(71) Applicant: YIELD MICROELECTRONICS CORP., Hsinchu County (TW)

(72) Inventors: Hsin-Chang Lin, Hsinchu County (TW); Wen-Chien Huang, Hsinchu County (TW); Ya-Ting Fan, Hsinchu County (TW); Yang-Sen Yeh, Hsinchu County (TW); Cheng-Ying Wu, Hsinchu County (TW)

(73) Assignee: Yield Microelectronics Corp., Chu-Pei (TW)

( * ) Notice: Subject to any disclaimer, the term of this patent is extended or adjusted under 35 U.S.C. 154(b) by 0 days.

(21) Appl. No.: 14/565,644

(22) Filed: Dec. 10, 2014

(51) Int. Cl.
  *G11C 16/10* (2006.01)
  *G11C 16/14* (2006.01)
  *G11C 16/04* (2006.01)
  *G11C 16/16* (2006.01)

(52) U.S. Cl.
  CPC ............ *G11C 16/14* (2013.01); *G11C 16/0408* (2013.01); *G11C 16/107* (2013.01); *G11C 16/16* (2013.01)

(58) Field of Classification Search
  CPC .................................................... G11C 16/107
  USPC .................................................... 365/185.18
  See application file for complete search history.

(56) References Cited

U.S. PATENT DOCUMENTS

| 6,075,738 | A  | * | 6/2000  | Takano  | G11C 11/5621 365/185.26 |
| 6,731,544 | B2 | * | 5/2004  | Han     | G11C 16/10 365/185.17   |
| 6,747,899 | B2 | * | 6/2004  | Hsia    | G11C 8/08 365/185.17    |
| 7,045,848 | B2 | * | 5/2006  | Shukuri | B82Y 10/00 257/311      |
| 7,817,472 | B2 | * | 10/2010 | Kuo     | G11C 16/0416 365/185.12 |

* cited by examiner

*Primary Examiner* — Son Mai
(74) *Attorney, Agent, or Firm* — Rosenberg, Klein & Lee

(57) ABSTRACT

A method for operating a low-cost EEPROM array is disclosed. The EEPROM array comprises bit lines, word lines, common source lines, and sub-memory arrays. The bit lines are divided into bit line groups. The word lines include a first word line and a second word line. The common source lines include a first common source line. Each sub-memory array includes a first memory cell and a second memory cell, which are respectively connected with the first and second word lines. Each of the first and second memory cells is also connected with the first bit line group and the first common source line. The first and second memory cells are operation memory cells and symmetrically arranged at two sides of the first common source line. The method operates all the operation memory cells and uses special biases to program or erase memory cells massively in a single operation.

20 Claims, 9 Drawing Sheets

METHOD FOR OPERATING LOW-COST EEPROM ARRAY

BACKGROUND OF THE INVENTION

1. Field of the Invention

The present invention relates to a memory array, particularly to a method for operating a low-cost EEPROM (Electrically Erasable Programmable Read Only Memory) array.

2. Description of the Related Art

The CMOS (Complementary Metal Oxide Semiconductor) technology has been a normal process for fabricating ASIC (Application Specific Integrated Circuit). Flash memories and EEPROM (Electrically Erasable Programmable Memory) have been widely used in electronic products because their data will not volatilize but can be erased and programmed electrically.

Non-volatile memories are programmable, storing charges to vary gate voltages of transistors, or not storing charges to preserve the original gate voltages of transistors. In erasing a non-volatile memory, the charges stored in the non-volatile memory are eliminated to resume the initial state of the memory. The flash memory architecture has advantages of small size and low cost. However, the flash memory architecture does not allow erasing or programming a single one-bit memory cell but allows erasing or programming a block of the memory. Therefore, the flash memory architecture is inconvenient in application. The EEPROM architecture supports a "byte write" function. Thus, the EEPROM architecture is more convenient than the flash memory architecture. Refer to FIG. 1 and FIG. 2 respectively schematically showing a circuit and a sectional view of a one-bit memory cell of the conventional EEPROM architecture. As shown in FIG. 1 and FIG. 2, the one-bit memory cell of the EEPROM architecture is a polysilicon memory cell and comprises a memory transistor 10, a selection transistor 12 and a capacitor structure disposed above the memory transistor 10. Because of the abovementioned memory cell structure, EEPROM occupies larger area than the flash memory. Besides, in bit erasing of EEPROM, the transistors at the unselected positions must be separated. Thus, the cost of using EEPROM is increased.

In order to overcome the abovementioned problems of the conventional technology, the Inventors develop a low-cost EEPROM array and propose a method for operating the same and massively programming the memory cells of the same simultaneously.

SUMMARY OF THE INVENTION

The primary objective of the present invention is to provide a method for operating a low-cost EEPROM (Electrically Erasable Programmable Read Only Memory) array, which uses a special bias method to massively program or erase memory cells of a low-cost small-area EEPROM array.

In order to achieve the abovementioned objective, the present invention proposes a method for operating a low-cost EEPROM array, which is applied to a low-cost EEPROM array. The low-cost EEPROM array comprises a plurality of parallel bit lines, a plurality of parallel word lines; a plurality of parallel common source lines; and a plurality of sub-memory arrays. The bit lines are divided into a plurality of bit line groups, including a first bit line group. The bit lines are vertical to the word lines. The word lines include a first word line and a second word line and are parallel to the common source lines. The common source lines include a first common source line. Each of the sub-memory arrays is connected with a bit line group, a pair of word lines and a common source line. Each sub-memory array contains a first memory cell and a second memory cell. The first memory cell is connected with the first bit line group, the first common source line and the first word line. The second memory cell is connected with the first bit line group, the first common source line and the second word line. The first memory cell and the second memory cell are symmetrically arranged at two sides of the first common source line.

Each of the first and second memory cells contains an N-type FET (Field Effect Transistor) and functions as an operation memory cell. While all the operation memory cells are selected to operate, a substrate voltage $V_{sub}$ is applied to the operation memory cells through the P-type substrate or the P-type well that is connected with all the operation memory cells. The bit lines, the word lines and the common source lines, which are connected with all the operation memory cells, respectively apply a bit voltage $V_b$, a word voltage $V_w$ and a common source voltage $V_s$ to program or erase the operation memory cells. In writing, the following conditions must be satisfied: $V_b$ is grounded, $V_s=V_b=0$, and $V_w$=HV (High Voltage). In erasing, the following conditions must be satisfied: $V_{sub}$ is grounded, $V_s=V_b$=HV, and $V_w$ is floating.

While the FETs of the first and second memory cells are P-type, the present invention further proposes another method for operating a low-cost EEPROM array. While all the operation memory cells are selected to operate, a substrate voltage $V_{sub}$ is applied to the operation memory cells through the N-type substrate or the N-type well that is connected with all the operation memory cells. The bit lines, the word lines and the common source lines, which are connected with all the operation memory cells, respectively apply a bit voltage $V_b$, a word voltage $V_w$ and a common source voltage $V_s$ to program or erase the operation memory cells. In writing, the following conditions must be satisfied: $V_{sub}$=HV, $V_s=V_b$=HV, and V=0. In erasing, the following conditions must be satisfied: $V_{sub}$=HV, $V_s=V_b=0$, and $V_w$ is floating.

Below, embodiments are described in detail in cooperation with the attached drawings to make easily understood the objectives, technical contents, characteristics and accomplishments of the present invention.

DETAILED DESCRIPTION OF THE INVENTION

Figure 1:
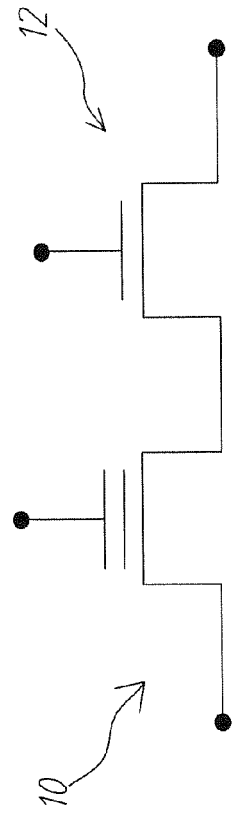
FIG. 1 schematically shows the circuit of a one-bit memory cell of a conventional EEPROM architecture.
Figure 2:
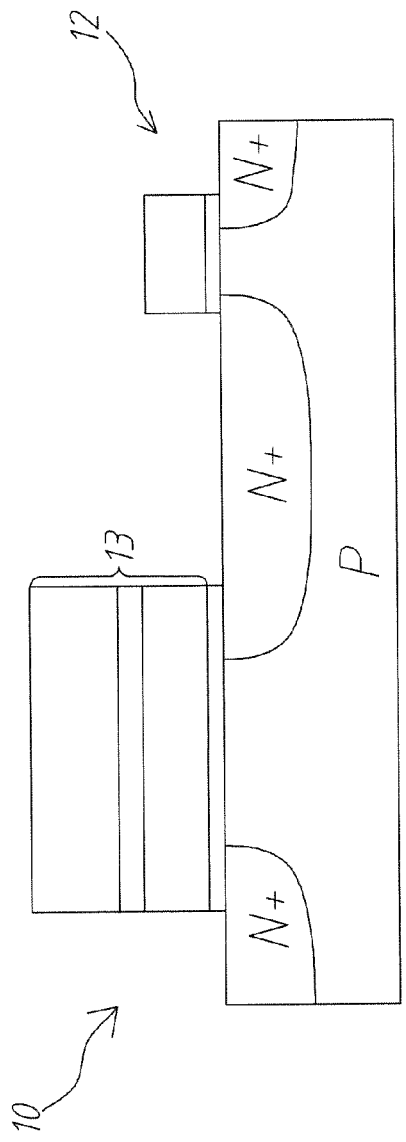
FIG. 2 schematically shows a sectional view of a one-bit memory cell of a conventional EEPROM architecture.
Figure 3:
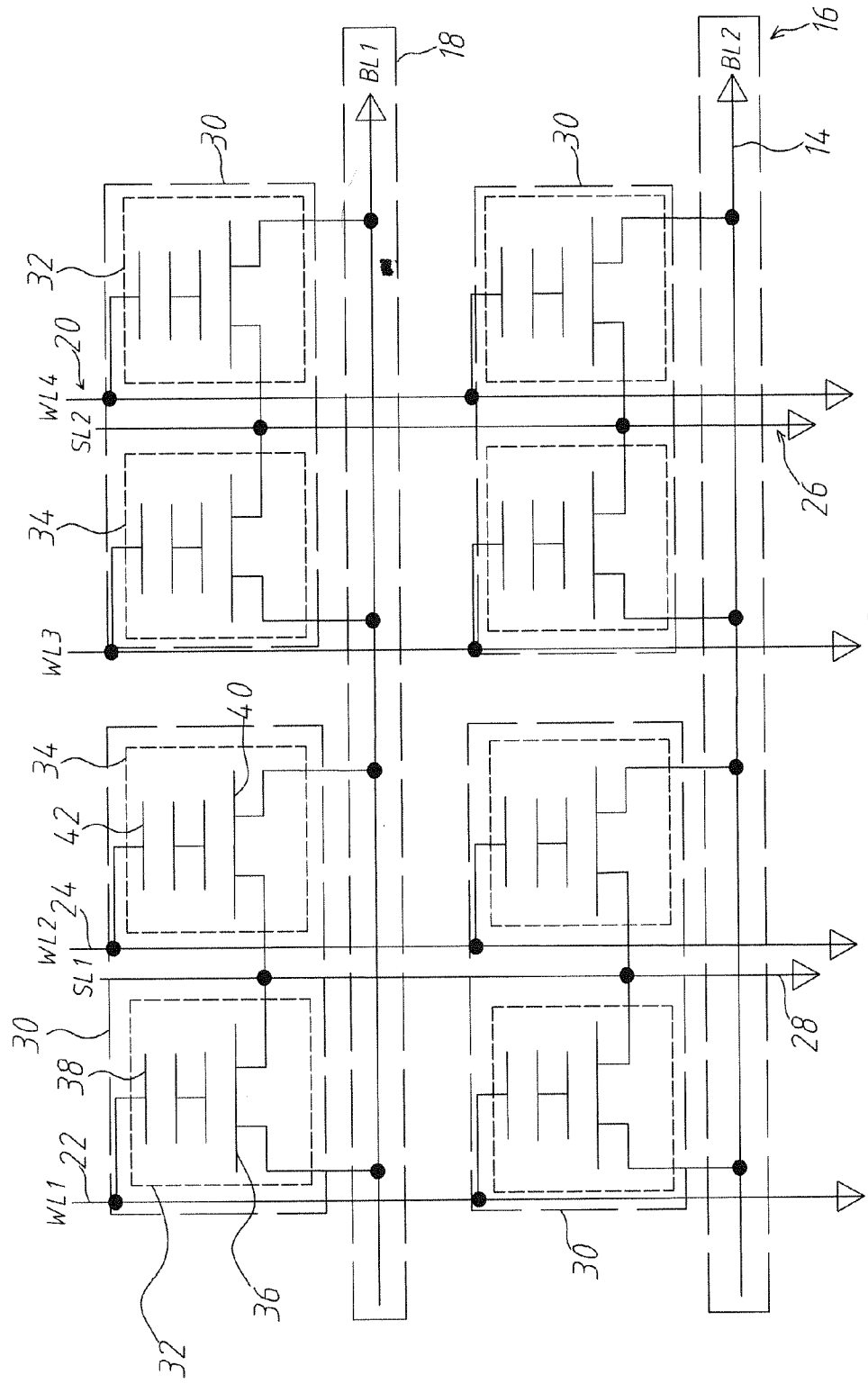
FIG. 3 schematically shows the circuit of a low-cost EEPROM array according to a first embodiment of the present invention.
Figure 4:
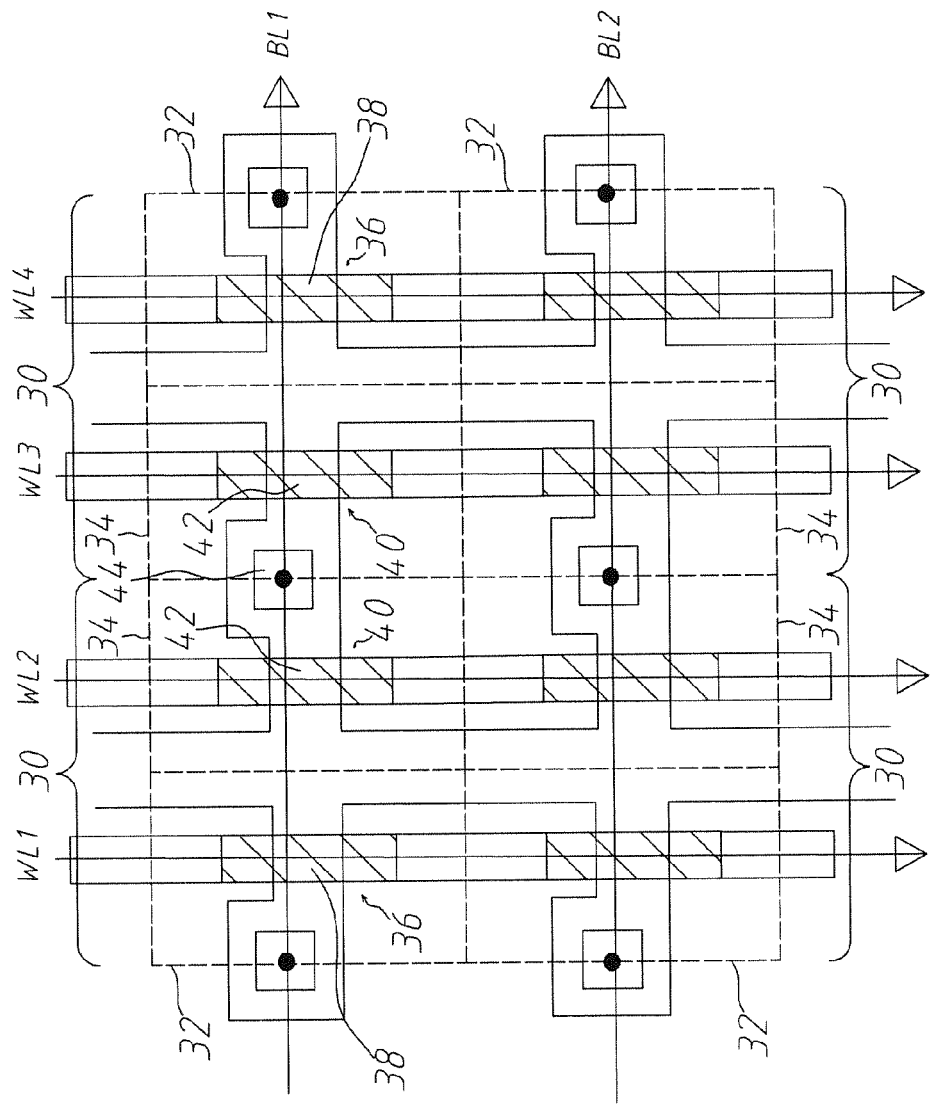
FIG. 4 schematically shows the layout of the circuit of a low-cost EEPROM array according to the first embodiment of the present invention.

Refer to FIG. 3 and FIG. 4 for a first embodiment of the present invention. The method for operating a low-cost EEPROM array is applied to a low-cost EEPROM array. The low-cost EEPROM array comprises a plurality of parallel bit lines 14; a plurality of parallel word lines 20; a plurality of parallel common source lines 26; and a plurality of sub-memory arrays 30. The bit lines 14 are divided into a plurality of bit line groups 16, including a first bit line group 18. The first bit line group 18 includes a bit line 14. The word lines 20 are vertical to the bit lines 14 and include a first word line 22 and a second word line 24. The common source lines 26 are parallel to the word lines 20 and include a first common source line 28. The bit lines 14, the word lines 20 and the common source lines 26 are connected with sub-memory arrays 30 each containing 2×1 pieces of memory cells. Each sub-memory array 30 is connected with one bit line group 16, two word lines 20 and one common source line 26. The connections of the sub-memory arrays 30 with the bit lines 14, the word lines 20 and the common source lines 26 are similar. The common characteristics of the connections are described below.

Figure 5:
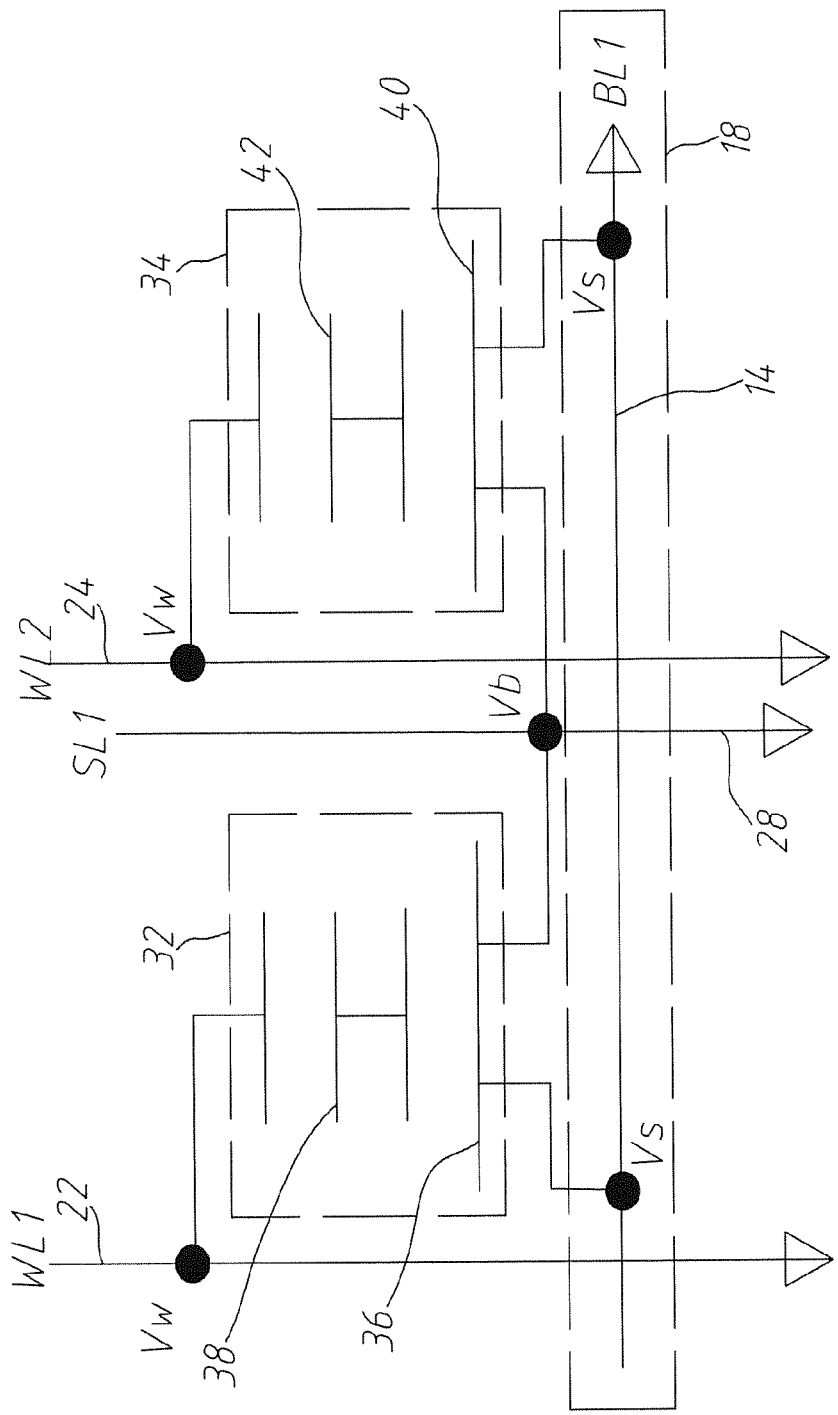
FIG. 5 schematically shows the circuit of a sub-memory array of a low-cost EEPROM array according to the first embodiment of the present invention.

Refer to FIG. 4 and FIG. 5. Each sub-memory array 30 includes a first memory cell 32 and a second memory cell 34. The first memory cell 32 is connected with the bit line 14 of the first bit line group 18, the first common source line 28 and the first word line 22. The second memory cell 34 is connected with the bit line 14 of the first bit line group 18, the first common source line 28 and the second word line 24. The first memory cell 32 and the second memory cell 34 are symmetrically arranged at two sides of the first common source line 28. In the first embodiment, two second memory cells 34 of two adjacent sub-memory arrays 30 are neighboring and share a common bit line 14 and a common contact, whereby the area of the overall layout is reduced.

The first memory cell 32 further includes an FET 36 (Field Effect Transistor) and a capacitor 38. The FET 36 has a floating gate, a drain connected with the bit line 14 of the first bit line group 18, and a source connected with the first common source line 28. One terminal of the capacitor 38 is connected with the floating gate of the FET 36, and the other terminal of the capacitor 38 is connected with the first word line 22 to receive a bias $V_w$ from the first word line 22. The FET 36 receives a bias $V_b$ from the bit line 14 of the first bit line group 18 and receives a bias $V_s$ from the first common source line 28 so as to write data into or erase data from the floating gate of the FET 36.

The second memory cell 34 further includes an FET 40 and a capacitor 42. The FET 40 has a floating gate, a drain connected with the bit line 14 of the first bit line group 18, and a source connected with the first common source line 28. One terminal of the capacitor 42 is connected with the floating gate of the FET 40, and the other terminal of of the capacitor 42 is connected with the second word line 24 to receive a bias $V_w$ from the second word line 24. The FET 40 receives a bias $V_b$ from the bit line 14 of the first bit line group 18 and receives a bias $V_s$ from the first common source line 28 so as to write data into or erase data from the floating gate of the FET 40. In two adjacent sub-memory arrays 30, the FETs 40 of two second memory cells 34 are neighboring and share a common bit line 14 and a common drain contact 44, whereby the area of the overall layout of the circuit is reduced.

Refer to FIG. 3 again. Both the FET 36 and the FET 40 are N-type FETs built in a P-type substrate or a P-type well. Alternatively, both the FET 36 and the FET 40 are P-type FETs built in an N-type substrate or an N-type well. The method for operating a low-cost EEPROM array has different sub-embodiments with respect to the types of FETs. Below, the sub-embodiment corresponding to the N-type FETs 36 and 40 is described firstly.

Both the abovementioned first and second memory cells 32 and 34 are operation memory cells. The present invention operates all the operation memory cells to execute writing or erasing. In the first embodiment, the following operating method can simultaneously program a great quantity of memory cells in a low-voltage and low-current condition.

A substrate voltage $V_{sub}$ is applied to the P-type substrate or the P-type well, which is connected with all the operation memory cells. A bit voltage $V_b$, a word voltage $V_w$ and a common source voltage $V_w$ are respectively applied to all the bit lines 14, word lines 20 and common source lines 26, which are connected with all the operation memory cells. In writing, the following conditions must be satisfied: $V_{sub}$ is grounded, $V_s=V_b=0$, and V=HV (High Voltage). In erasing, the following conditions must be satisfied: $V_{sub}$ is grounded, Vs=$V_b$=HV, and $V_w$ is floating.

While the FET 36 and the FET 40 are P-type FETs, a substrate voltage $V_{sub}$ is applied to the N-type substrate or the N-type well. In writing, the following conditions must be satisfied: $V_{sub}$=HV, $V_s=V_b$=HV, and $V_w$=0. In erasing, the following conditions must be satisfied: $V_{sub}$=HV, $V_s=V_b$=0, and $V_w$ is floating. Herein, the voltage symbols have the same definitions as those used above.

The abovementioned bias method can realize "byte write" and "byte erase" for the non-volatile memory in an environment free of extrinsic insulating transistors.

Figure 6:
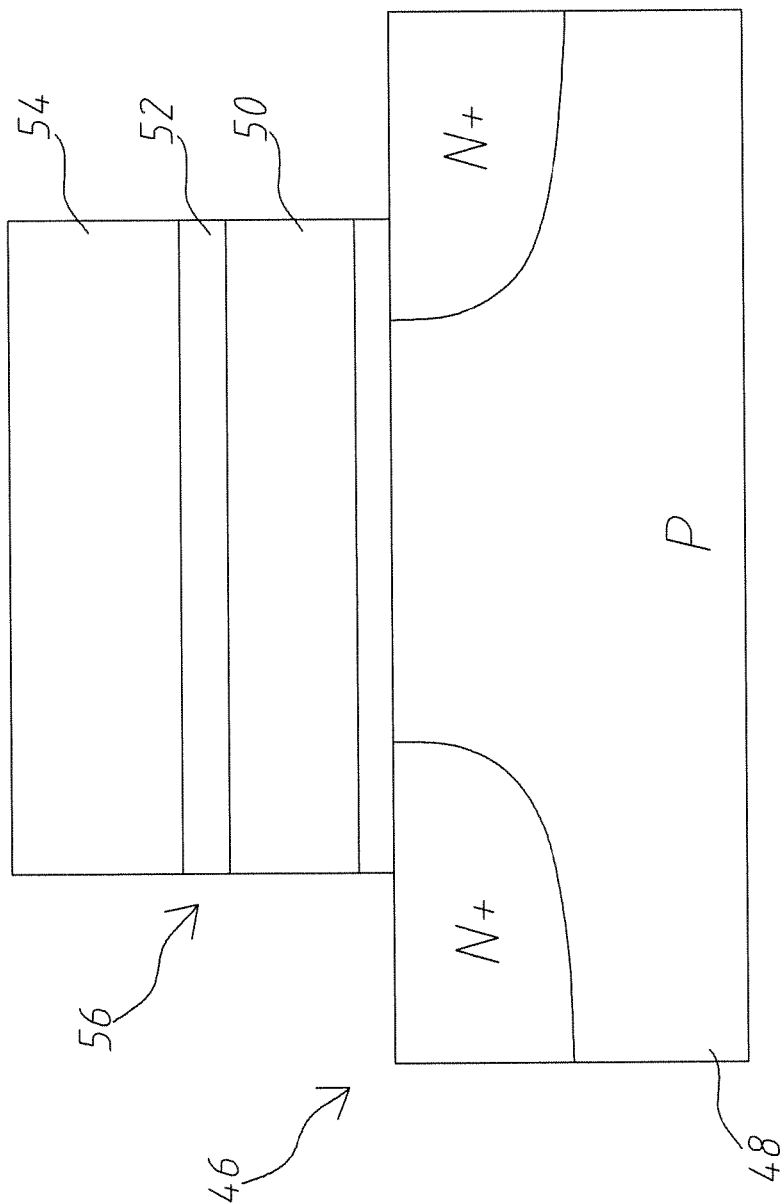
FIG. 6 schematically shows a sectional view of an N-type FET and a capacitor of a memory cell according to one embodiment of the present invention.

The structures of the FETs 36 and 40 and the capacitors 38 and 42 are described below. Refer to FIG. 6, wherein an N-type FET is used to exemplify the FETs 36 and 40. An N-type FET 46 is formed in a P-type semiconductor substrate 48 and has a floating gate 50. An oxide layer 52 and a control gate 54 are formed above the floating gate 50 in sequence. The control gate 54, the oxide layer 52 and the floating gate 50 jointly form a capacitor 56. The floating gate 50 and the control gate 54 are made of polysilicon. If the semiconductor substrate is an N-type semiconductor substrate, a P-type well is formed in the N-type semiconductor substrate. Then, the N-type FET 46 is formed in the P-type well. The abovementioned structure of the memory cell is the fundamental architecture of the flash memory and able to significantly reduce the area and cost of the non-volatile memory array.

Figure 7:
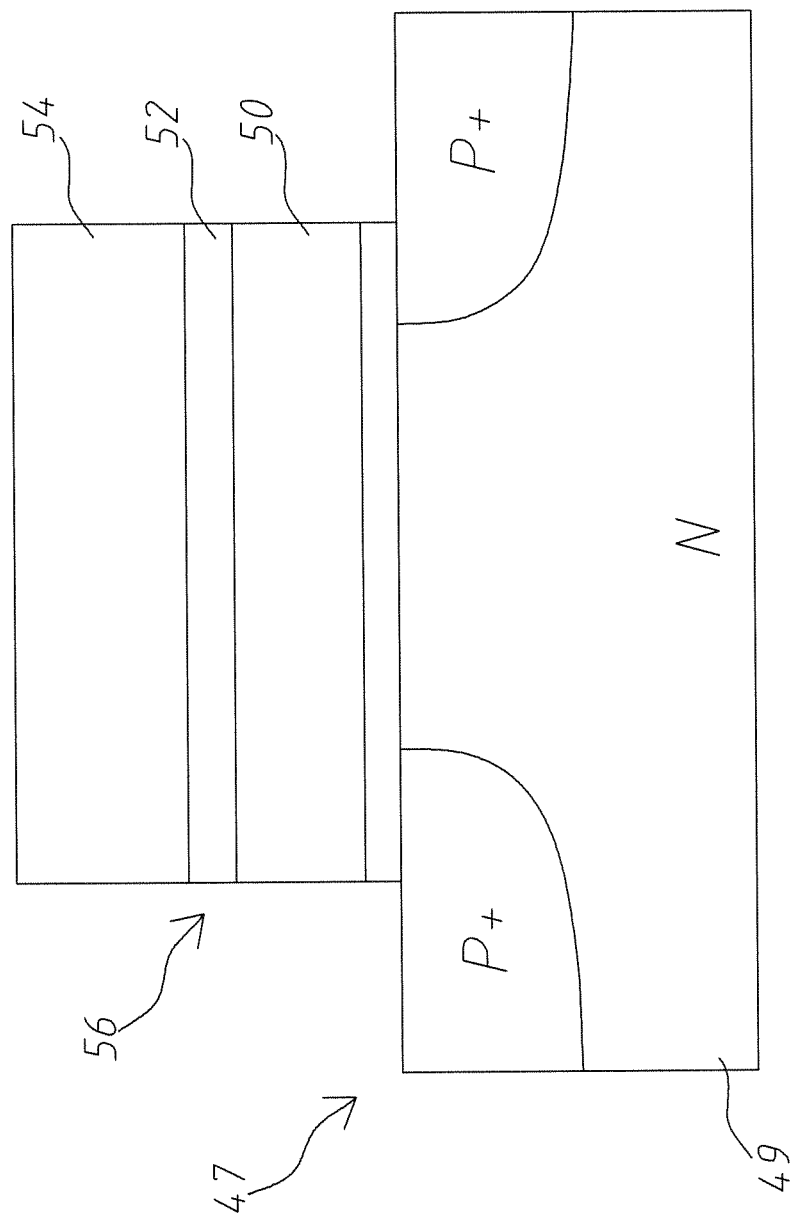
FIG. 7 schematically shows a sectional view of a P-type FET and a capacitor of a memory cell according to one embodiment of the present invention.

Refer to FIG. 7, wherein a P-type FET is used to exemplify the FETs 36 and 40. A P-type FET 47 is formed in an N-type semiconductor substrate 49 and has a floating gate 50. An oxide layer 52 and a control gate 54 are formed above the floating gate 50 in sequence. The control gate 54, the oxide layer 52 and the floating gate 50 jointly form a capacitor 56. The floating gate 50 and the control gate 54 are made of polysilicon. If the semiconductor substrate is a P-type semiconductor substrate, an N-type well is formed in the P-type semiconductor substrate. Then, the P-type FET 47 is formed in the N-type well.

Figure 8:
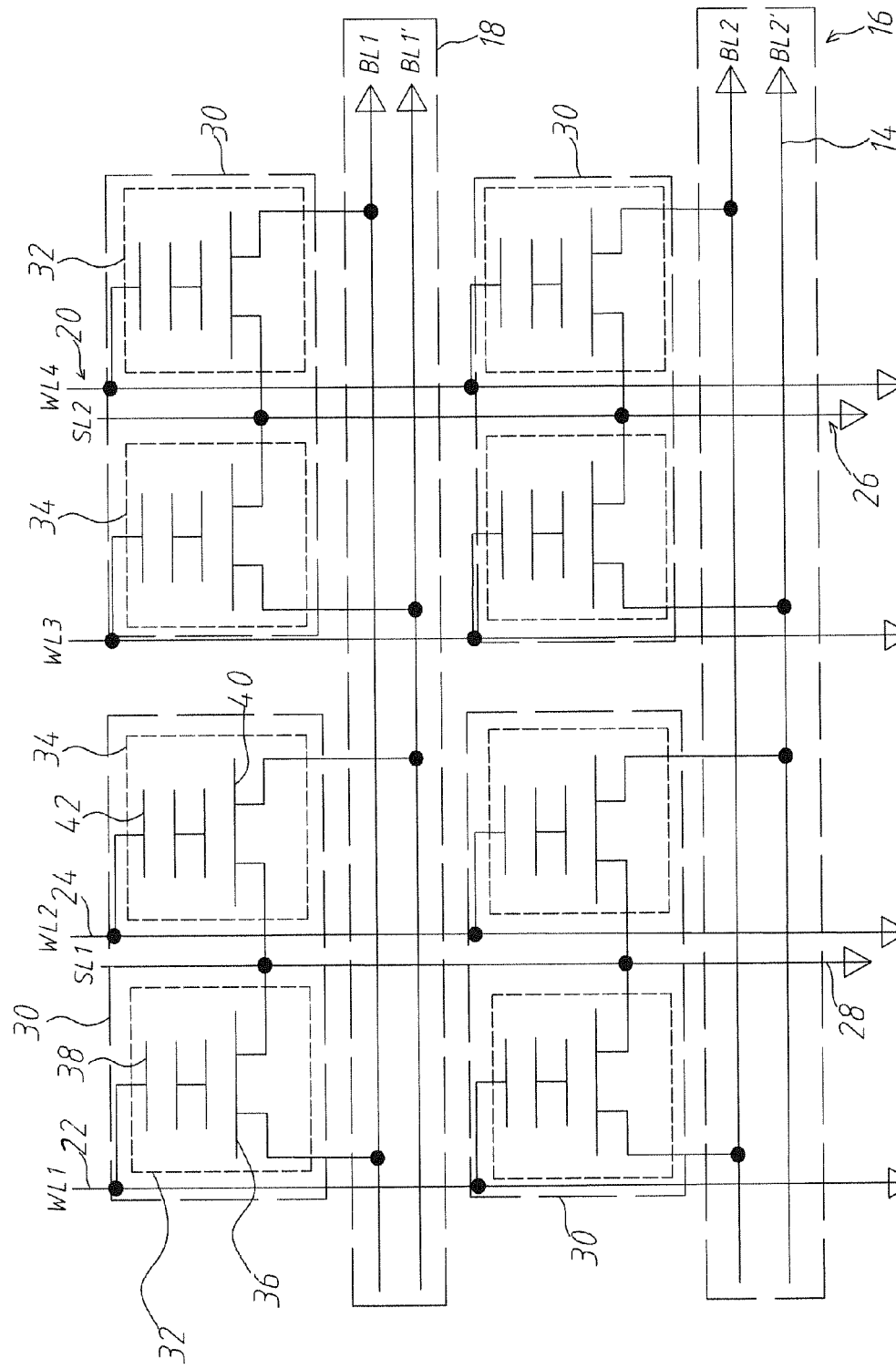
FIG. 8 schematically shows the circuit of a low-cost EEPROM array according to a second embodiment of the present invention.
Figure 9:
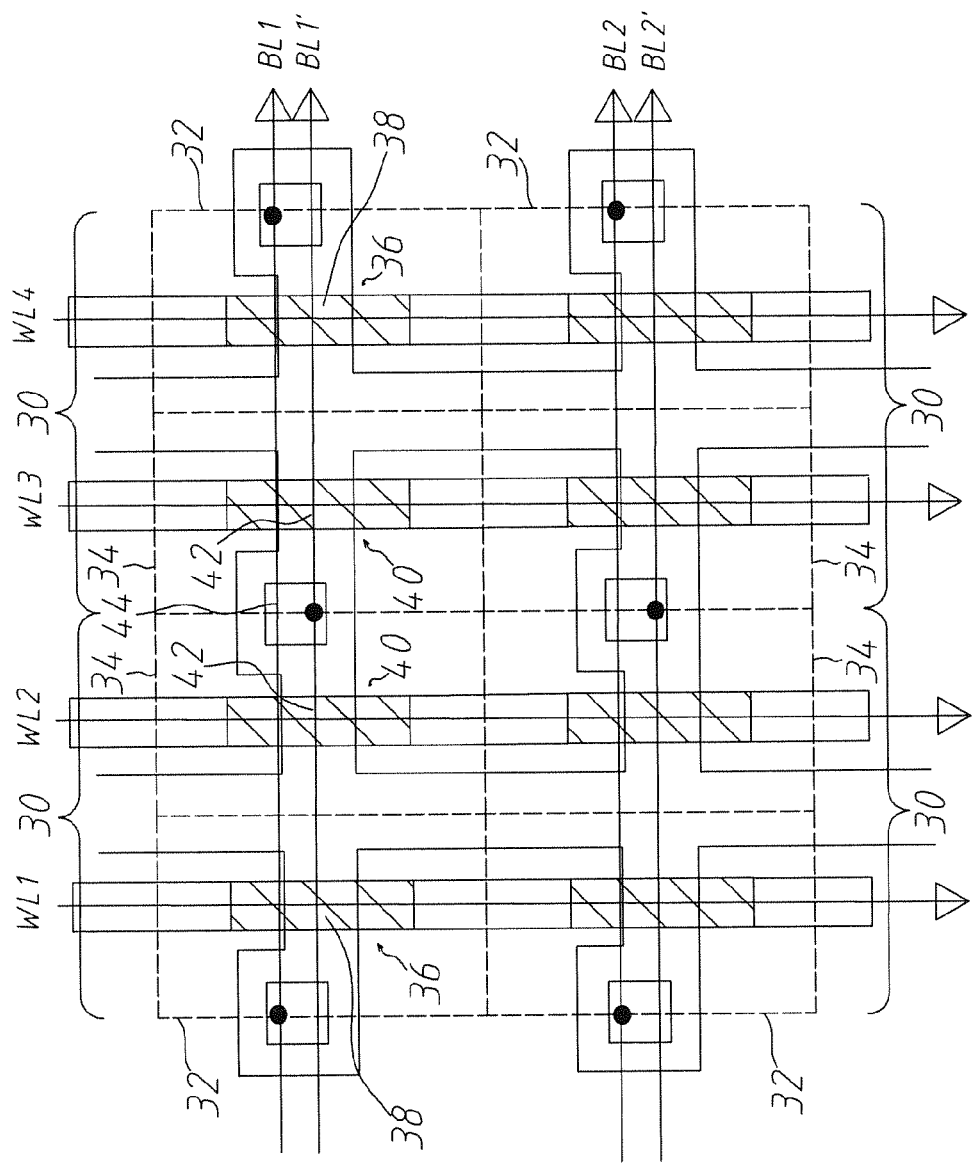
FIG. 9 schematically shows the layout of the circuit of a low-cost EEPROM array according to the second embodiment of the present invention.
Figure 10:
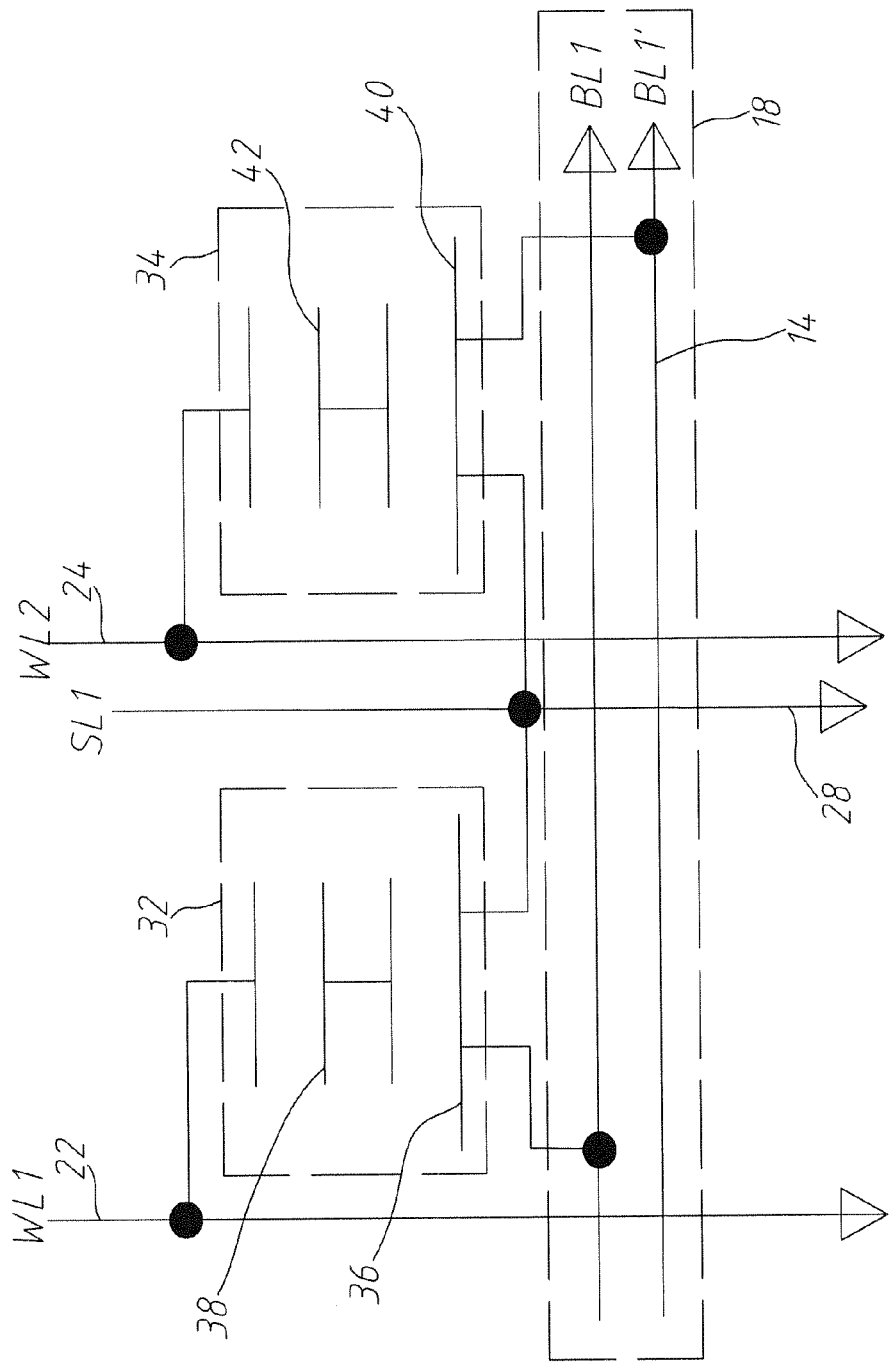
FIG. 10 schematically shows the circuit of a sub-memory array of a low-cost EEPROM array according to the second embodiment of the present invention.

Refer to FIGS. 8-10 for a second embodiment of the present invention. The second embodiment is different from the first embodiment in that each bit line group includes two bit lines 14. Therefore, the first bit line group 18 also includes two bit lines 14, which are respectively connected with the first memory cell 32 and the second memory cell 34 of the same sub-memory array 30. In the second embodiment, two second memory cells 34 of two adjacent sub-memory arrays 30 are neighboring and share a common bit line 14 and a common contact. In other words, the FETs 40 of two second memory cells 34 are neighboring and share a common bit line 14 and a common drain contact 44. Thereby, the area of the overall layout of the circuit is reduced.

Refer to FIG. 8 again. Both the FET 36 and the FET 40 are N-type FETs built in a P-type substrate or a P-type well. Alternatively, both the FET 36 and the FET 40 are P-type FETs built in an N-type substrate or an N-type well. The method for operating a low-cost EEPROM array has different sub-embodiments with respect to the types of FETs. Below, the sub-embodiment corresponding to the N-type FETs 36 and 40 is described firstly.

Both the abovementioned first and second memory cells 32 and 34 are operation memory cells. The present invention operates all the operation memory cells to execute writing or erasing. In the second embodiment, the following operating method can simultaneously program a great quantity of memory cells in a low-voltage and low-current condition.

A substrate voltage $V_{sub}$ is applied to the P-type substrate or the P-type well, which is connected with all the operation memory cells. A bit voltage $V_b$, a word voltage $V_w$ and a common source voltage $V_s$ are respectively applied to all the bit lines 14, word lines 20 and the common source lines 26, which are connected with all the operation memory cells. In writing, the following conditions must be satisfied: $V_{sub}$ is grounded, $V_s=V_b=0$, and $V_w$=HV (High Voltage). In erasing, the following conditions must be satisfied: $V_{sub}$ is grounded, $V_s=V_b$=HV, and $V_w$ is floating.

While the FET 36 and the FET 40 are P-type FETs, a substrate voltage $V_{sub}$ is applied to the N-type substrate or the N-type well. In writing, the following conditions must be satisfied: $V_{sub}$=HV, $V_s=V_b$=HV, and $V_w$=0. In erasing, the following conditions must be satisfied: $V_{sub}$=HV, $V_s=V_b$=0, and $V_w$ is floating. Herein, the voltage symbols have the same definitions as those used above.

The abovementioned bias method can realize "byte write" and "byte erase" for the non-volatile memory in an environment free of extrinsic insulating transistors.

In the second embodiment, the first memory cell 32 and the second memory cell 34 of the same sub-memory array 30 are respectively connected with two bit lines 14. Therefore, the first word line 22 and the second word line 24 of the same sub-memory array 30 can be connected with an identical bias, i.e. connected with an identical line, without affecting the functions of "byte write" and "byte erase". Thereby, the area of the decoding region is reduced.

A charge pump converts a lower-voltage supply of 2.5V or 3.3V into a stable higher-voltage supply for programming the memory cells. However, the voltage drop between the drain and the source generates a current and thus causes fluctuation of the high voltage. The more intense the current, the greater the fluctuation of the high voltage, and the more powerful the charge pump required. A more power charge pump would occupy a larger area. Normally, a flash memory architecture undertakes programming in the bias method: a high voltage is applied to the gate capacitor and the drain, and the source is grounded, with a current of 500 μA/bit between the drain and the source. In programming all the memory cells, the present invention applies a high voltage to the gate capacitor. In erasing, the present invention applies high voltages to the source and the drain. The high voltages applied to the source and the drain are respectively 9V and 7V, wherein the system respectively boosts a voltage of 5V and a voltage of 3.5V to a voltage of 9V and a voltage of 7V, which are much lower than the withstanding voltage of the transistors. Via the abovementioned bias conditions, the present invention can erase all the memory cells in a single operation and can also program all the memory cells in a single operation, without any load. Therefore, the present invention can use smaller charge pumps and achieve higher efficiency.

The FETs 36 and 40 and the capacitors 38 and 42 of the second embodiments are the same as those of the first embodiment and will not repeat herein.

In conclusion, the method of the present invention can uses the bias conditions to program or erase all the memory cells in a single operation and thus can massively program memory cells for a small-area and low-cost EEPROM array.

The present invention has been demonstrated in detail with the abovementioned embodiments. However, it should be noted: these embodiments are only to exemplify the present invention but not to limit the scope of the present invention. Any equivalent modification or variation according to the shapes, structures, characteristics and principles disclosed in the specification is to be also included within the scope of the present invention.

What is claimed is:

1. A method for operating a low-cost electrically erasable programmable read only memory array, wherein said low-cost electrically erasable programmable read only memory (EEPROM) array comprises a plurality of parallel bit lines; a plurality of parallel word lines; a plurality of parallel common source lines; and a plurality of sub-memory arrays, and wherein said bit lines are divided into a plurality of bit line groups including a first bit line group, and wherein said word lines are vertical to said bit lines and include a first word line and a second word line, and wherein said common source lines are parallel to said word lines and include a first common source line, and wherein each said sub-memory array is connected with one said bit line group, two said word lines and one said common source line, and wherein each said sub-memory array includes a first memory cell and a second memory cell, and wherein said first memory cell is connected with said first bit line group, said first common source line and said first word line, and wherein said second memory cell is connected with said first bit line group, said first common source line and said second word line, and wherein said first memory cell and said second memory cell are symmetrically arranged at two sides of said first common source line, and wherein each of said first memory cell and said second memory cell has an N-type field-effect transistor (FET) built in a P-type substrate or a P-type well, and wherein each of said first memory cell and said second memory cell is an operation memory cell, and wherein in operating all said operation memory cells, said method is characterized in that a substrate voltage $V_{sub}$ is applied to said P-type substrate or said P-type well, which is connected with all said operation memory cells, and that a bit voltage $V_b$, a word voltage $V_w$ and a common source voltage $V_s$ are respectively applied to all said bit lines, said word lines and said common source lines, which are connected with all said operation memory cells, and that in writing, following conditions must be satisfied:
$V_{sub}$ is grounded,
$V_s=V_b=0$, and
$V_w$=HV (High Voltage); and that in erasing, following conditions must be satisfied:
$V_{sub}$ is grounded,
$V_s=V_b$=HV, and
$V_w$ is floating.

2. The method for operating a low-cost electrically erasable programmable read only memory array according to claim 1, wherein said first bit line group includes one said bit line, which is connected with said first memory cell and said second memory cell.

3. The method for operating a low-cost electrically erasable programmable read only memory array according to claim 1, wherein said first bit line group includes two said bit lines, which are respectively connected with said first memory cell and said second memory cell.

4. The method for operating a low-cost electrically erasable programmable read only memory array according to claim 2, wherein two said second memory cells of two adjacent said sub-memory arrays are neighboring and share one common said bit line and a common contact.

5. The method for operating a low-cost electrically erasable programmable read only memory array according to claim 3, wherein two said second memory cells of two adjacent said sub-memory arrays are neighboring and share one common said bit line and a common contact.

6. The method for operating a low-cost electrically erasable programmable read only memory array according to claim 1, wherein said N-type FET of said first memory cell has a floating gate, a drain connected with said first bit line group, and a source connected with said first common source, and wherein said first memory cell also has a capacitor, and wherein one terminal of said capacitor is connected with said floating gate, and wherein another terminal of said capacitor is connected with said first word line to receive a bias from said first word line, and wherein said N-type FET receives a bias from said first bit line group and receives a bias from said first common source line to write data into or erase data from said floating gate of said N-type FET.

7. The method for operating a low-cost electrically erasable programmable read only memory array according to claim 1, wherein said N-type FET of said second memory cell has a floating gate, a drain connected with said first bit line group, and a source connected with said first common source, and wherein said second memory cell also has a capacitor, and wherein one terminal of said capacitor is connected with said floating gate, and wherein another terminal of said capacitor is connected with said second word line to receive a bias from said second word line, and wherein said N-type FET receives a bias from said first bit line group and receives a bias from said first common source line to write data into or erase data from said floating gate of said N-type FET.

8. The method for operating a low-cost electrically erasable programmable read only memory array according to claim 6, wherein an oxide layer and a control gate are formed above said floating gate in sequence, and wherein said control gate, said oxide layer and said floating gate jointly form a capacitor, and wherein said floating gate and said control gate are made of polysilicon.

9. The method for operating a low-cost electrically erasable programmable read only memory array according to claim 7, wherein an oxide layer and a control gate are formed above said floating gate in sequence, and wherein said control gate, said oxide layer and said floating gate jointly form a capacitor, and wherein said floating gate and said control gate are made of polysilicon.

10. The method for operating a low-cost electrically erasable programmable read only memory array according to claim 3, wherein said first word line and said second word line of an identical said sub-memory array are connected with an identical said word voltage.

11. A method for operating a low-cost electrically erasable programmable read only memory array, wherein said low-cost electrically erasable programmable read only memory (EEPROM) array comprises a plurality of parallel bit lines; a plurality of parallel word lines; a plurality of parallel common source lines; and a plurality of sub-memory arrays, and wherein said bit lines are divided into a plurality of bit line groups including a first bit line group, and wherein said word lines are vertical to said bit lines and include a first word line and a second word line, and wherein said common source lines are parallel to said word lines and include a first common source line, and wherein one said sub-memory array is connected with one said bit line group, two said word lines and one said common source line, and wherein each said sub-memory array includes a first memory cell and a second memory cell, and wherein said first memory cell is connected with said first bit line group, said first common source line and said first word line, and wherein said second memory cell is connected with said first bit line group, said first common source line and said second word line, and wherein said first memory cell and said second memory cell are symmetrically arranged at two sides of said first common source line, and wherein each of said first memory cell and said second memory cell has a P-type field-effect transistor (FET) built in an N-type substrate or an N-type well, and wherein each of said first memory cell and said second memory cell is an operation memory cell, and wherein in operating all said operation memory cells, said method is characterized in that a substrate voltage $V_{sub}$ is applied to said N-type substrate or said N-type well, which is connected with all said operation memory cells, and that a bit voltage $V_b$, a word voltage $V_w$ and a common source voltage $V_s$ are respectively applied to all said bit lines, said word lines and said common source lines, which are connected with all said operation memory cells, and that in writing, following conditions must be satisfied:
$V_{sub}$ HV (High Voltage),
$V_s=V_b=$HV, and
$V_w=0$; and that in erasing, following conditions must be satisfied:
$V_{sub}=$HV,
$V_s=V_b=0$, and
$V_w$ is floating.

12. The method for operating a low-cost electrically erasable programmable read only memory array according to claim 11, wherein aid first bit line group includes one said bit line, which is connected with said first memory cell and said second memory cell.

13. The method for operating a low-cost electrically erasable programmable read only memory array according to claim 11, wherein said first bit line group includes two said bit lines, which are respectively connected with said first memory cell and said second memory cell.

14. The method for operating a low-cost electrically erasable programmable read only memory array according to claim 12, wherein two said second memory cells of two adjacent said sub-memory arrays are neighboring and share one common said bit line and a common contact.

15. The method for operating a low-cost electrically erasable programmable read only memory array according to claim 13, wherein two said second memory cells of two adjacent said sub-memory arrays are neighboring and share one common said bit line and a common contact.

16. The method for operating a low-cost electrically erasable programmable read only memory array according to claim 11, wherein said P-type FET of said first memory cell has a floating gate, a drain connected with said first bit line group, and a source connected with said first common source, and wherein said first memory cell also has a capacitor, and wherein one terminal of said capacitor is connected with said floating gate, and wherein another terminal of said capacitor is connected with said first word line to receive a bias from said first word line, and wherein said P-type FET receives a bias from said first bit line group and receives a bias from said first common source line to write data into or erase data from said floating gate of said P-type FET.

17. The method for operating a low-cost electrically erasable programmable read only memory array according to claim 11, wherein said P-type FET of said second memory cell has a floating gate, a drain connected with said first bit line group, and a source connected with said first common source, and wherein said second memory cell also has a capacitor, and wherein one terminal of said capacitor is connected with said floating gate, and wherein another terminal of said capacitor is connected with said second word line to receive a bias from said second word line, and wherein said P-type FET receives a bias from said first bit line group and receives a bias from said first common source line to write data into or erase data from said floating gate of said P-type FET.

18. The method for operating a low-cost electrically erasable programmable read only memory array according to claim 16, wherein an oxide layer and a control gate are formed above said floating gate in sequence, and wherein said control gate, said oxide layer and said floating gate jointly form a capacitor, and wherein said floating gate and said control gate are made of polysilicon.

19. The method for operating a low-cost electrically erasable programmable read only memory array according to claim 17, wherein an oxide layer and a control gate are formed above said floating gate in sequence, and wherein said control gate, said oxide layer and said floating gate jointly form a capacitor, and wherein said floating gate and said control gate are made of polysilicon.

20. The method for operating a low-cost electrically erasable programmable read only memory array according to claim 13, wherein said first word line and said second word line of an identical said sub-memory array are connected with an identical said word voltage.

* * * * *